United States Patent
Sakaguchi et al.

(10) Patent No.: US 6,259,038 B1
(45) Date of Patent: Jul. 10, 2001

(54) SEMICONDUCTOR CHIP MOUNTING BOARD AND METHOD OF INSPECTING THE SAME MOUNTING BOARD

(75) Inventors: Hideaki Sakaguchi; Naoyuki Koizumi; Kenkichi Arai, all of Nagano (JP)

(73) Assignee: Shinko Electric Industries Co., Ltd. (JP)

(*) Notice: Subject to any disclaimer, the term of this patent is extended or adjusted under 35 U.S.C. 154(b) by 0 days.

(21) Appl. No.: 09/358,053

(22) Filed: Jul. 21, 1999

(30) Foreign Application Priority Data

Jul. 24, 1998 (JP) .................................................. 10-209992

(51) Int. Cl.⁷ ................................. H01R 9/09; H05K 7/10
(52) U.S. Cl. ...................... 174/261; 174/262; 174/263; 174/267; 257/738; 257/778; 257/780; 361/771; 361/774; 361/767; 361/768; 356/371; 356/375
(58) Field of Search ..................... 174/261, 260, 174/254, 267, 52.1, 262, 263; 261/760, 743, 774; 361/767, 771, 768; 257/698, 778, 780; 356/371, 228, 375

(56) References Cited

U.S. PATENT DOCUMENTS

| | | | |
|---|---|---|---|
| 5,378,859 | * | 1/1995 | Shirasaki et al. .................. 174/261 |
| 5,465,152 | | 11/1995 | Bilodeau et al. .................. 356/371 |
| 5,489,750 | * | 2/1996 | Sakemi et al. .................. 174/261 |
| 5,641,946 | * | 6/1997 | Shim ............................... 174/261 |
| 5,738,269 | | 4/1998 | Masterton ......................... 228/248 |
| 5,847,936 | * | 12/1998 | Forehand et al. .................. 361/794 |
| 5,906,309 | | 5/1999 | Hashimoto et al. ................ 228/9 |
| 5,973,930 | * | 10/1999 | Ikeda et al. ....................... 361/768 |
| 5,973,931 | * | 10/1999 | Fukasawa ......................... 361/774 |
| 6,013,944 | * | 1/2000 | Moriya et al. ..................... 257/688 |
| 6,038,135 | * | 3/2000 | Higashiguchi et al. ............. 361/778 |

FOREIGN PATENT DOCUMENTS

| | | |
|---|---|---|
| 0531984 | * 3/1993 | (DE) . |
| 2-080905 | 3/1990 | (JP) . |
| 4-79261 | 12/1992 | (JP) . |
| 408279664 | * 10/1996 | (JP) . |
| 8-327327 | 12/1996 | (JP) . |
| 9-159415 | 6/1997 | (JP) . |
| 11087896 | * 3/1999 | (JP) . |

OTHER PUBLICATIONS

English Abstract of JP 4–79261.

* cited by examiner

Primary Examiner—Jeffrey Gaffin
Assistant Examiner—J B Patel
(74) Attorney, Agent, or Firm—Pennie & Edmonds LLP

(57) ABSTRACT

A semiconductor chip mounting circuit board includes a substrate, a wiring circuit formed on a substrate, a conducting pad electrically connected to an electrode of a semiconductor chip which is to be mounted on the substrate. An insulating resist layer is formed on the substrate to cover the wiring circuit and the resist layer has an opening to expose therein the conducting pad. A conducting bump is formed on the conducting pad exposed in the opening. A resist layer has a measuring opening which exposes a reference surface. A height of the conducting bump can be measured by an optical means using the measuring opening.

22 Claims, 14 Drawing Sheets

SEMICONDUCTOR CHIP MOUNTING BOARD AND METHOD OF INSPECTING THE SAME MOUNTING BOARD

BACKGROUND OF THE INVENTION

1. Field of the Invention

The present invention relates to a circuit board for mounting a semiconductor chip (hereinafter referred to as a circuit board), wherein conductor bumps to be electrically connected to electrodes of the semiconductor carried on a substrate of the circuit board are formed on conductor pads formed on a surface of the substrate of the circuit board, and a method for inspecting the same.

2. Description of the Related Art

As examples of such a circuit board as described above, there are a first circuit board shown in FIGS. 14 to 16 and 17 to 19 and a second circuit board shown in FIGS. 20 to 22.

In the first circuit board, a circuit pattern 20 is formed on a surface of a substrate 10 thereof. A conductor pad 30 of a disc shape or other is formed on the circuit pattern 20. The substrate 10 is made of insulating material such as resin or ceramic. The circuit pattern 20 and the conductor pad 30 are formed by etching a copper foil adhered to the surface of the substrate 10 or by etching a metal skin applied to the surface of an insulating resin layer by a build-up system on the substrate 10.

A resist layer 40 comprised of insulating resin or the like is broadly formed on the surface of the substrate 10 for the purpose of preventing solder from sticking to the surface of the substrate 10.

The first circuit board shown in FIGS. 14 to 16 has an opening 50 in the resist layer 40, in which are consecutively exposed the conductor pad 30, the circuit pattern 20 adjacent thereto and a surface of a portion of the substrate 10 therearound.

The first circuit board shown in FIGS. 17 to 19 has an opening 50 in the resist layer 40, in which is exposed a central portion of the conductor pad 30.

A conductor bump 60 is formed on the conductor pad 30 exposed in the opening 50, which is of a sermispherical shape and constituted by conductive resin plated with solder or Au or mixed with conductive filler.

On the other hand, a metallized conductor pad 30 of a disc shape is provided on the surface of the substrate 10 made of ceramic or the like in the second circuit board. The conductor pad 30 is connected to the upper end of a column-like metallized conductor via 22 pierced through the substrate 10 in the thickness direction. The conductor via 22 constitutes a circuit pattern.

A resist layer 40 formed of insulating resin or the like is broadly formed on the surface of the substrate 10 for the purpose of preventing solder from sticking thereto. A circular opening 50 is formed in the resist layer 40 so that a central portion of the conductor pad 30 is exposed therein.

A conductor bump 60 is formed on the conductor pad 30 exposed in the opening 50 and is of a semispherical shape and is constituted by conductive resin plated with solder or Au or mixed with conductive filler.

In the prior art, when the first circuit board and the second circuit board are inspected, as shown in FIG. 16, 19 or 22, a height hl from the surface of the resist layer 40 to a top of the conductor bump 60 is measured by means of an optical detector using a laser beam or a visible ray (hereinafter referred merely to a "photometer") or a CCD (which is an abridgement of Charge Coupled Device) camera. Then, based on this measured value, a height h2 from the surface of the substrate 10 to the top of the conductor bump 60 or a height h3 from the upper surface of the conductor pad 30 to the top of conductor bump 60 are estimated. Next, based on this estimated value, a variation of heights of the conductor bumps is determined. Finally, based on this variation, it is determined whether or not the above-mentioned first and second circuit boards are acceptable.

The determination of whether or not the first and second circuit boards are acceptable is important because, if a large variation exists in height of the respective conductor bump 60 formed on the conductor pad 30 exposed in each of a plurality of openings 50 formed in the resist layer 40 in a matrix manner as shown in FIGS. 23 and 24, there might be a risk in that when a plurality of conductor bumps 90 formed on electrodes arranged in correspondence to the conductor pads 30 on one side of a semiconductor chip 80 in a matrix manner are pressed onto the plurality of conductor bumps 60 at a predetermined pressure so that both the conductor bumps 60, 90 are at once welded or pressbonded together, all of the conductor bumps 60 and 90 may not be electrically connected to each other in a reliable manner.

According to the above-mentioned determination in the prior art wherein the height h1 is first measured, then the heights h2 and h3 are estimated thereby, and finally the variation of the height of the conductor bump 60 is calculated from the estimated values, it is impossible to correctly obtain the actual variation of the height of the conductor bump 60.

This reason therefor is as follows.

There are two methods for forming the resist layer 40; one method wherein a resist liquid is coated broadly on the surface of the substrate 10, which is then dried at a high temperature, and another method wherein a dry film of resist formed in a sheet form is adhered onto the surface of the substrate 10, which is then dried at a high temperature.

The surface of the resist layer 40 formed broadly on the surface of the substrate 10 by these methods is not evenly flat but tends to undulate up and down, causing a variation in height everywhere on the surface of the resist layer 40.

Therefore, it impossible to use the surface of the resist layer 40 formed on the surface of the substrate 10 in the above-mentioned manner as a reference surface for the correct estimation of the height h2 or h3.

To solve such a problem, two methods are proposed; a first one wherein the height h2 is directly measured by an optical detector or a CCD camera while using, as a reference surface, the surface of the substrate 10 in the vicinity of the conductor bump 50 exposed in the opening 50, and a second one wherein the height h3 is directly measured by an optical detector or a CCD camera.

According to the first or second method, it is believed that the variation f a height of the conductor bump 60 formed on the substrate 10 is correctly determined.

The first and second methods, however, could not be applied to the above-mentioned first or second circuit board of the prior art.

The reason why the height h2 from the surface of the substrate 10 to the top of the conductor bump 60 could not be measured by the first method is that a gap between the conductor bump 60 and the inner wall of the opening 50 is too narrow as shown in FIGS. 15 and 16, and therefore a width of the surface area of the substrate 10 exposed in the gap is also too small. When one wishes to directly measure the height h2 from the surface of the substrate 10 in the vicinity of the bump 60 exposed in the opening 50 to the top of the conductor bump 60 by the first method while using the optical detector, it is necessary to emit a laser beam or a visible ray from the optical detector disposed above the resist layer 40 onto the surface of the substrate 10 and reflect or diffuse the same to be directed to the optical detector. Such a reflected or diffused ray, however, is difficult to make incident upon the optical detector due to the interference with the conductor bump 60 or the resist layer 40. on the other hand, if a CCD camera is used to directly measure the height from the surface of the substrate 10 in the vicinity of the bump 60 exposed in the opening 50 to the top of the conductor bump 60 by the first method, it is also difficult to focus the CCD camera on the surface of the substrate 10 of a narrow width.

To enable the height h2 to be directly measured by the first method while using an optical detector, a CCD camera or the like, it is suggested to provide a large opening 50 in the resist layer 40 so that the surface of the substrate 10 is broadly exposed in the vicinity of the conductor bump 60 within the opening 50.

In such a case, however, there is a wide space between the conductor pad 30 exposed in the opening 50 and the inner side of the neighboring resist layer 40, whereby it is impossible to properly form a generally semispherical conductor bump 60 having a predetermined height on the conductor pad 30 in the opening 50 while effectively using the neighboring resist layer 40. Accordingly, the formation of large opening 50 in the resist layer 40 as described above could not be adopted.

The reason why the height h3 could not be measured by the second method is that the laser beam or a visible ray cannot pass through the conductor bump 60 to reach the upper surface of the conductor pad 30 beneath the former. Also, the laser beam or the visible ray reflected or diffused on the conductor pad 30 cannot pass through the conductor bump 60 to reach the optical detector or the CCD camera disposed above the resist layer 40.

SUMMARY OF THE INVENTION

An object of the present invention is to provide a circuit board for mounting a semiconductor chip (hereinafter referred to as a circuit board) wherein the variation of heights of conductor bumps formed on a substrate for the circuit board can be directly, easily and reliably measured by an optical detector or a CCD camera.

Another object of the present invention is to provide a circuit board for mounting a semiconductor chip which can solve the problems in the prior art mentioned above.

A further object of the present invention is to provide a method for inspecting or measuring the circuit board, particularly the heights of conductor bumps of such a circuit board.

To achieve the above object, according to the present invention, a first circuit board is provided, wherein conductor pads to be electrically connected to electrodes of a semiconductor chip mounted to the substrate are formed on a circuit pattern provided on a surface of a substrate, and a resist layer made of insulating resin or the like is broadly formed on the surface of the substrate on which the circuit pattern and the conductor pads are provided, and wherein openings are formed in the resist layer so that the conductor pads are exposed therein, respectively, and the conductor bump is formed on the conductor pad exposed in the opening, characterized in that measurement holes are provided in the resist layer, in each of which is exposed a reference surface having a predetermined size or more necessary for measuring a height of the conductor bump by using an optical detector or a CCD camera.

Also, a second circuit board of the present invention is provided, wherein conductor pads to be electrically connected to electrodes of a semiconductor chip mounted to a substrate are formed on a surface of the substrate and of conductor pad is connected to an upper end of a conductor-via formed vertically through the substrate, and a resist layer made of insulating resin or the like is broadly formed on the surface of the substrate on which the conductor pads are provided, and wherein openings are formed in the resist layer so that the conductor pads are exposed therein, respectively, and the conductor bump is formed on the conductor pad exposed in the opening, characterized in that measurement holes are provided in the resist layer, in each of which is exposed a reference surface having a predetermined size or more necessary for measuring a height of the conductor bump by using an optical detector or a CCD camera.

In the first or second circuit board, the measurement hole is broadly opened in the resist layer so that the reference surface having a predetermined size or more is exposed in the measurement hole.

Accordingly, it is possible to direct a laser beam or a visible ray emitted from the optical detector disposed above the resist layer to the substrate through the broad measurement hole without interference from the resist layer. The laser beam or visible ray is projected onto the reference surface having the predetermined size or more exposed in the measurement hole and is reflected or diffused thereon. The reflected or diffused ray is incident upon the optical detector disposed above the resist layer through the broadly opened measurement hole.

Together therewith, the laser beam or visible ray emitted from an optical detector disposed above the resist layer is incident upon a top of the conductor bump in the opening and reflects or diffuses thereon. Then, the reflected or diffused ray is incident upon the optical detector disposed above the resist layer.

It is possible to directly measure the height from the reference surface to the top of the conductor bump by means of the optical detector while using the reflected or diffused ray reflected or diffused on the reference surface and incident upon the optical detector and that reflected or diffused on the top of the conductor bump and incident upon the optical detector. Based on the measured value, it is possible to correctly determine the variation of the height of the conductor bump formed on the substrate.

Alternatively, it is possible to easily and correctly focus a CCD camera, disposed above the resist layer on the reference surface having a predetermined size or more exposed in the measurement hole formed in the resist layer, without interference from the resist layer. Then, a distance from the CCD camera to the reference surface is measured by the CCD camera.

Together therewith, it is possible to focus a CCD camera on the top of the conductor bump in the opening and measure a distance from the CCD camera to the top of the conductor bump by the CCD camera.

Based on the difference between the distances from these CCD cameras, the height from the reference surface to the top of the conductor bump can be directly measured. Then, based on the measured value, it is possible to correctly determine the variation of the height of the conductor bump formed on the substrate.

In the first circuit board of the present invention, the reference surface is preferably defined by the substrate surface, the upper surface of the circuit pattern or the upper surface of the reference pattern provided on the substrate surface.

In the second circuit board of the present invention, the reference surface is preferably defined by the substrate surface or the upper surface of the reference pattern formed on the substrate surface.

In the first or second circuit board, while defining a reference surface on the surface of the circuit pattern, the upper surface of the circuit pattern or the upper surface of the reference pattern, it is possible to directly measure the height h2 from the surface of the substrate to the top of the conductor bump, or to directly measure the height h4 from the upper surface of the circuit pattern to the top of the conductor bump, or to directly measure the height from the upper surface of the reference pattern to the top of the conductor bump. Based on the results of the measurements, the variation of the height of the conductor bump formed on the substrate is correctly determined.

When the circuit pattern defining the reference surface on its upper surface is formed to have the same thickness as the conductor pad, it is possible to correctly surmise that the height h3 from the upper surface of the conductor pad to the top of the conductor bump is the above-mentioned height h4. Based on this estimated value, the variation of the height of the conductor bump formed on the substrate can be correctly determined.

When the circuit pattern defining the reference surface on its upper surface has a thickness different from that of the conductor pad, the height h3 from the upper surface of the conductor pad to the top of the conductor bump can be correctly determined from the above-mentioned h4 while taking the difference in thickness between the circuit pattern and the conductor pad into account. Based on this estimated value, it is possible to correctly determine the variation of the height of the height of the conductor bump formed on the substrate.

In the first or second circuit board according to the present invention, the measurement hole may be formed separately from the opening in the resist layer.

The measurement hole may be preferably formed in the resist layer in continuous with the opening.

According to the circuit board wherein the measurement hole is formed separately from the opening in the resist layer, it is possible to prevent part of the inner wall of the opening from being bored by the measurement hole. When the conductor bump is formed on the conductor pad exposed in the opening, it is possible to prevent the conductor bump from bulging to the bored inner wall of the opening, and to obtain a generally semispherical shape of the conductor bump.

According to the circuit board wherein the measurement hole is formed continuous with the opening in the resist layer, it is possible to provide a measurement hole formed in an implement for coating a resist resin for forming the resist layer over the surface of the substrate, continuous with an opening provided in the implement. Thereby the implement for coating the resist resin can be simplified.

According to the present invention, there is provided a method for measuring a height of the conducting bump comprising: the following steps of:

(1) irradiating a laser or visible beam from a position above the resist layer through said measuring opening toward the reference surface and receiving the laser or visible beam reflected or dispersed at the reference surface through the measuring opening, (2) irradiating a laser or visible beam from the position above the resist layer through the opening toward a top of the conducting bump and receiving the laser or visible beam reflected or dispersed at said conducting bump through the opening; and (3) comparing these reflected or dispersed beams to determine the height of the conducting bump.

In this connection, the order of these steps (1), (2) and (3) may either be step (1), step (2) and step (3), or step (2), step (1) and step (3).

DETAILED DESCRIPTION OF THE EMBODIMENTS

The present invention will be described in more detail with reference to the preferred embodiments illustrated in the attached drawings.

FIGS. 1, 2, 3 and 4 are partially enlarged plan views of preferred embodiments of a first circuit board according to the present invention, respectively.

Figure 1:
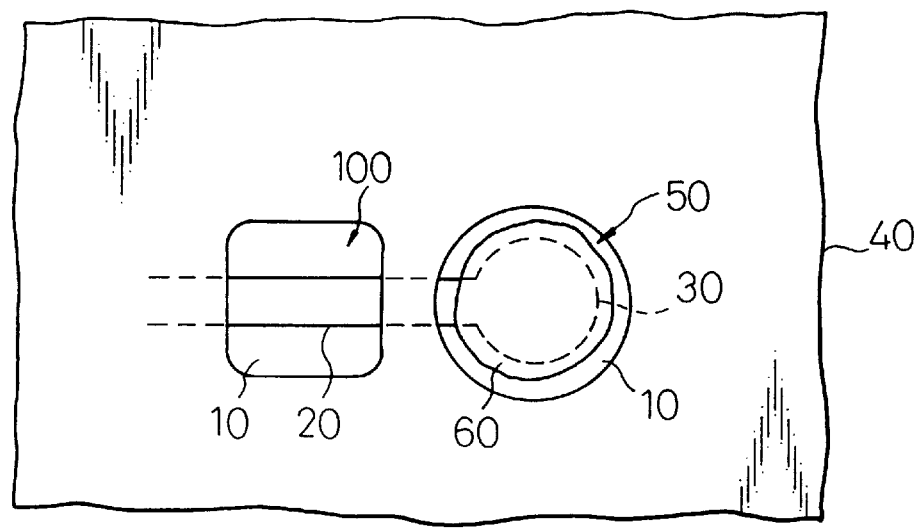
FIGS. 1 to 6 are partially enlarged plan views of various aspects of a first circuit board of the present invention, respectively.
Figure 3:
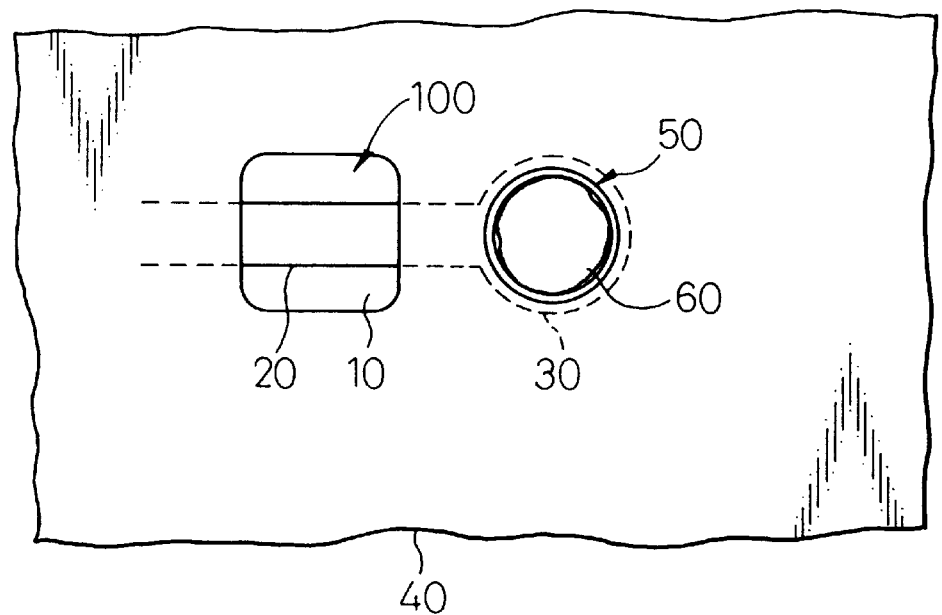

A square-shaped measurement hole 100 is provided in a resist layer 40 in each of the first circuit boards shown in FIGS. 1 and 3 and the vicinity of an opening 50 but at a distance therefrom. A surface of a substrate 1O on which a circuit pattern 20 is formed is exposed within the measurement hole 100.

Figure 2:
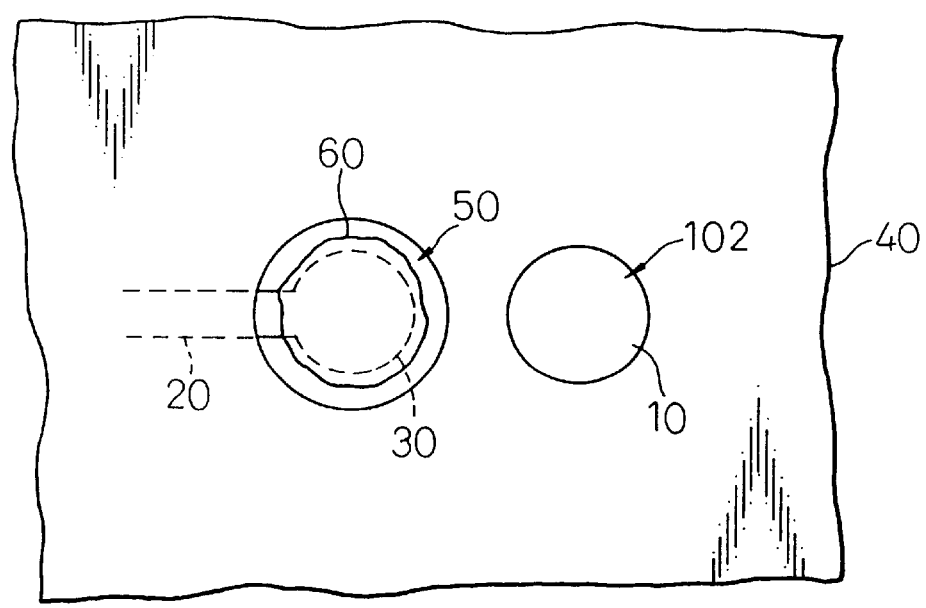
Figure 4:
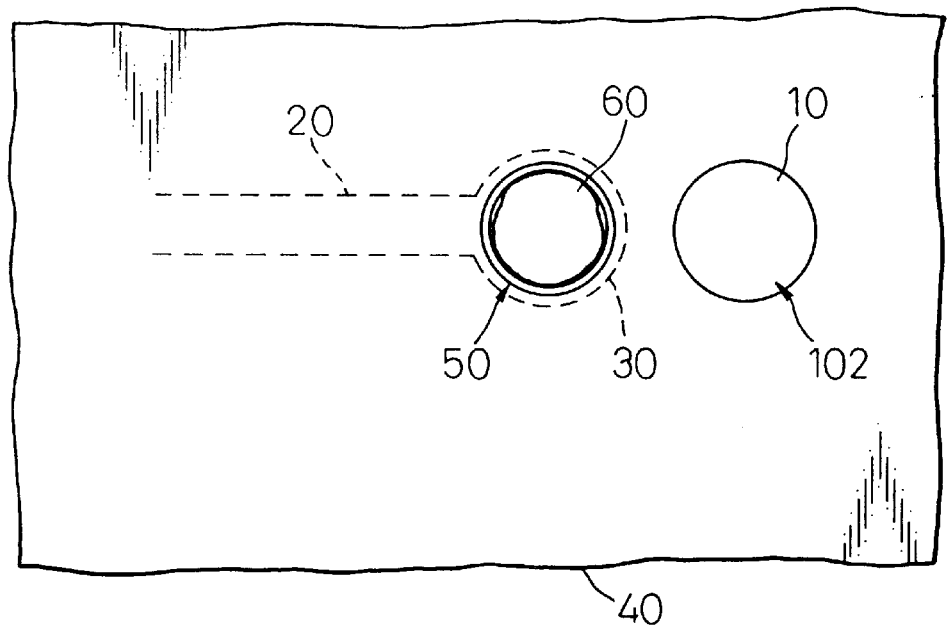

A circular-shaped measurement hole 102 is provided in a resist layer 40 in each of the first circuit boards shown in FIGS. 2 and 4, in the vicinity of an opening 50 at a distance therefrom. A surface of a substrate 10 on which a circuit pattern 20 is not formed is exposed within the measurement hole 102.

The measurement hole 100 or 102 has a predetermined open size or more so that the surface of the substrate 10 or the upper surface of the circuit pattern 20 defining a reference surface of a predetermined size or more is exposed within the measurement hole 100 or 102. Accordingly, a laser beam or a visible ray emitted from the above-mentioned optical detector (not shown) disposed above the resist layer 40 can be directed to the substrate 10 via the measurement hole 100 or 102, and reflected or diffused on the surface of the substrate 10 or the upper surface of the circuit pattern 20 exposed in the measurement hole 100 or 102. The reflected or diffused ray is incident upon the optical detector through the measurement hole 100 or 102 without interference from the resist layer 40 around the measurement hole 100 or 102, Alternatively, the CCD camera disposed above the resist layer 40 can be easily and correctly focussed on the surface of the substrate 100 or the upper surface of the circuit pattern 20 of the predetermined size or more exposed in the measurement hole 100 or 102 without interference from the resist layer 40 around the measurement hole 100 or 102.

Each of the first circuit boards shown in FIGS. 1, 2, 3 and 4 has the same structure, other than above, as that of the first circuit board described with reference to FIGS. 14 to 16 or 17 to 19, whereby it is possible to project the reflected or diffused ray upon the optical detector disposed above the resist layer 40.

By using the reflected or diffused ray reflected or diffused on the surface of the substrate 10 and incident upon the optical detector and the reflected or diffused ray reflected or diffused on the top of the conductor bump 60 and incident upon the optical detector, the height h2 can be directly measured by the optical detector. Then, based on the measured value, the variation of the height of the conductor bump 60 can be correctly determined.

Alternatively, it is possible to easily and properly focus the CCD camera disposed above the resist layer 40 on the surface with a predetermined size or more of the substrate 10 exposed in the measurement hole 100 or 102, without interference from the resist layer 40 and the distance from the CCD camera to the surface of the substrate 10 can be measured by the CCD camera.

Together therewith, it is possible to focus a CCD camera disposed above the resist layer 40 on the top of the conductor bump 60 in the opening 50 and the distance from the CCD camera to the top of the conductor bump 60 is measurable by the CCD camera.

Then, based on the difference between these distances from the CCD camera, the height h2 is directly measurable. Thereafter, the height variation of the conductor bumps 60 can be correctly determined from the measured values.

It is possible to measure the height h4 from the upper surface of the circuit pattern 20 defining the reference surface to the top of the conductor bump 60 measured by the optical detector while using the reflected or diffused ray reflected or diffused on the upper surface of the circuit pattern 20, which then is incident upon the optical detector, and the reflected or diffused ray reflected or diffused on the top of the conductor bump 60, which is then incident upon the optical detector.

Also, it is possible to measure the distance from a CCD camera to the upper surface of the circuit pattern 20 by the CCD camera.

Based on the difference between distances from these CCD cameras, the height h4 from the upper surface of the circuit pattern 20 defining the reference surface to the top of the conductor bump 60 is directly measurable.

If the circuit pattern 20 is formed to have the same thickness as the conductor pad 30, it is apparent that the height h3 from the upper surface of the conductor pad 30 to the top of the conductor bump 60 is correctly the same as the above-mentioned height h4. Based on this estimated value, it is possible to correctly determine the variation of the height of the top of the conductor bump 60 formed on the substrate 10.

If the circuit pattern 20 is formed to have a different thickness from the conductor pad 30, it is possible to correctly estimate the height h3 from the upper surface of the conductor pad 30 to the top of the conductor bump 60 while taking the difference in thickness between the circuit pattern 20 and the conductor pad 30 into account. Based on this estimated value, it is possible to correctly determine the variation of the height of the conductor bump 60 formed on the substrate 10.

Figure 5:
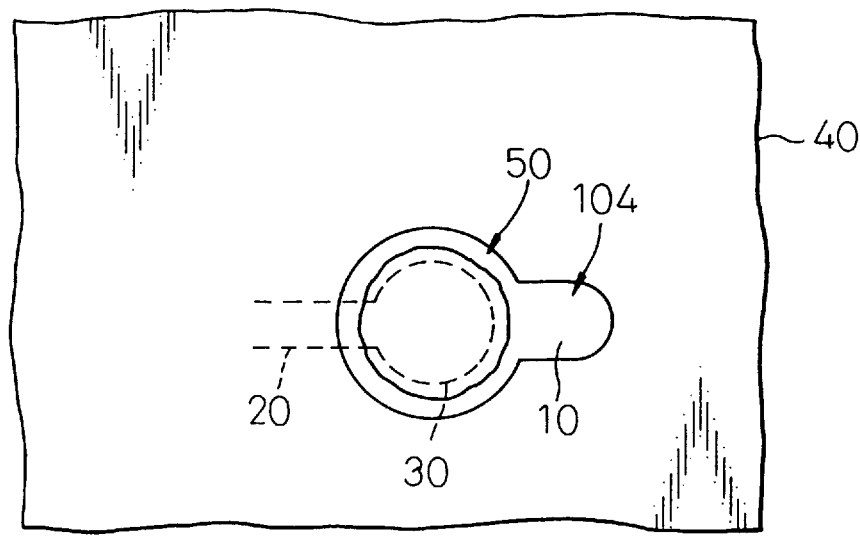
Figure 6:
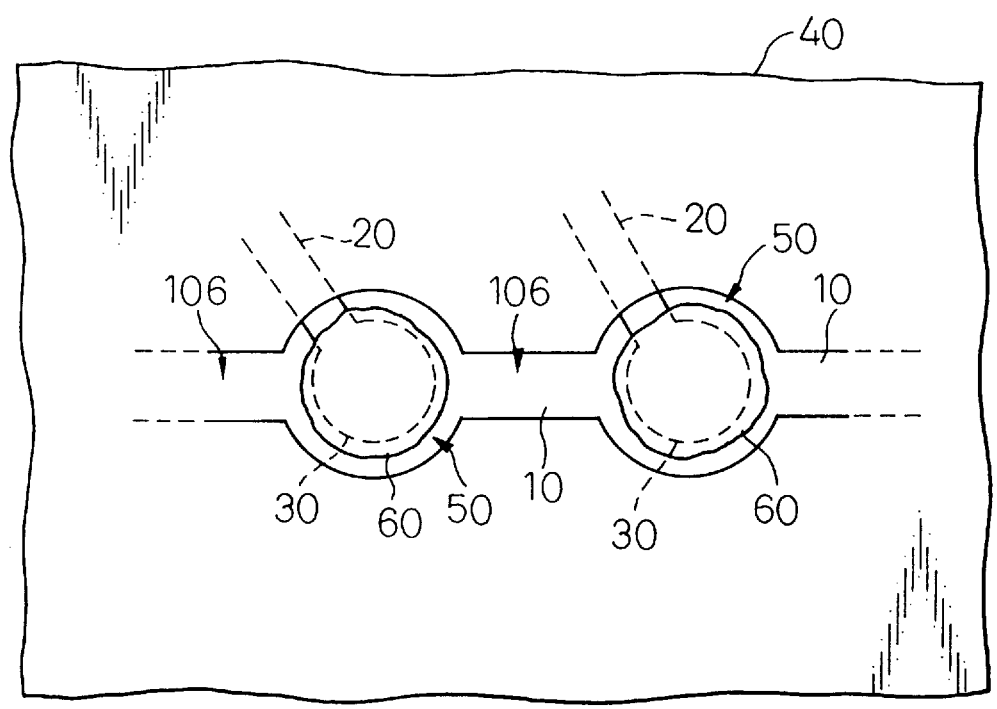

FIGS. 5 and 6 are partially enlarged plan views, respectively, of other preferable embodiments of a first circuit board of the present invention.

In the first circuit board shown in FIG. 5, an elongate measurement hole 104 extending outward from the opening 50 is formed in the resist layer 40.

In the first circuit board shown in FIG. 6, an elongate measurement hole 106, of a strip form, extending between two adjacent openings 50 is formed in the resist layer 40.

Each of the measurement holes 104 and 106 has a predetermined size or more whereby a surface of the substrate 10 defining a reference surface of a predetermined size or more is exposed in the measurement hole 104, 106. Thus, a laser beam or a visible ray emitted from the optical detector (not shown) disposed above the resist layer 40 is directed to the surface of the substrate 10 exposed in the measurement hole 104 or 106 through the measurement hole 104 or 106 without interference from the resist layer 40 therearound is and reflected or diffused on the substrate surface. Alternatively, the CCD camera disposed above the resist layer 40 is easily and properly focussed on the surface of the substrate 10 having the predetermined size or more and defining the reference surface exposed in the measurement holes 104 or 106, without interference from the resist layer 40 around the measurement hole 104 or 106.

Figure 14:
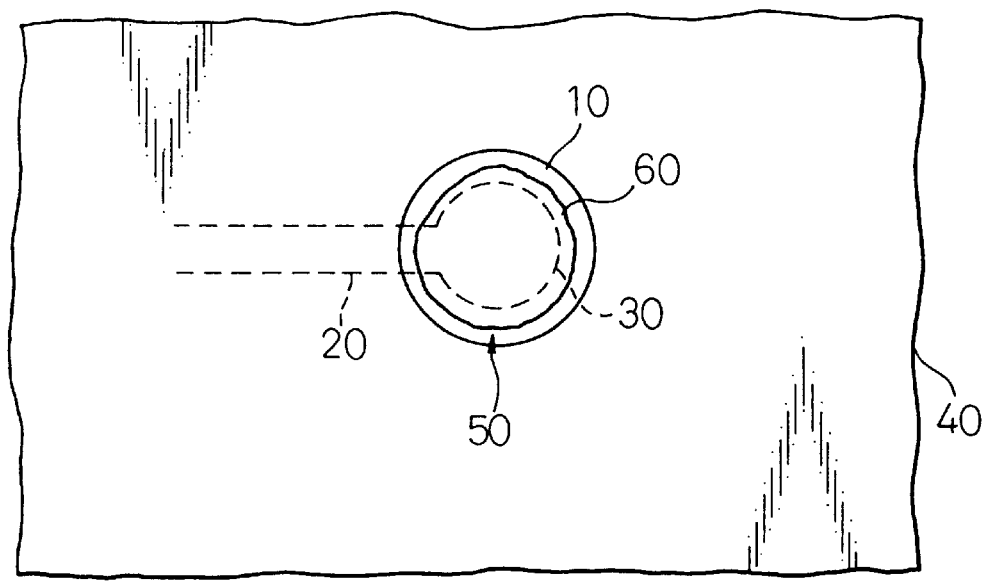
FIGS. 14 and 15 are a partially enlarged plan view and a sectional view of a first circuit board, respectively.
Figure 15:
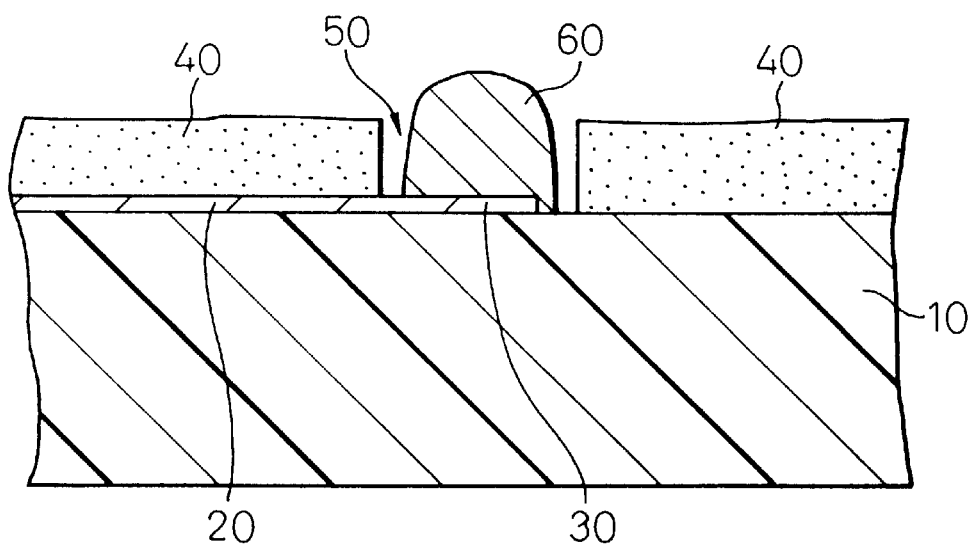
Figure 16:
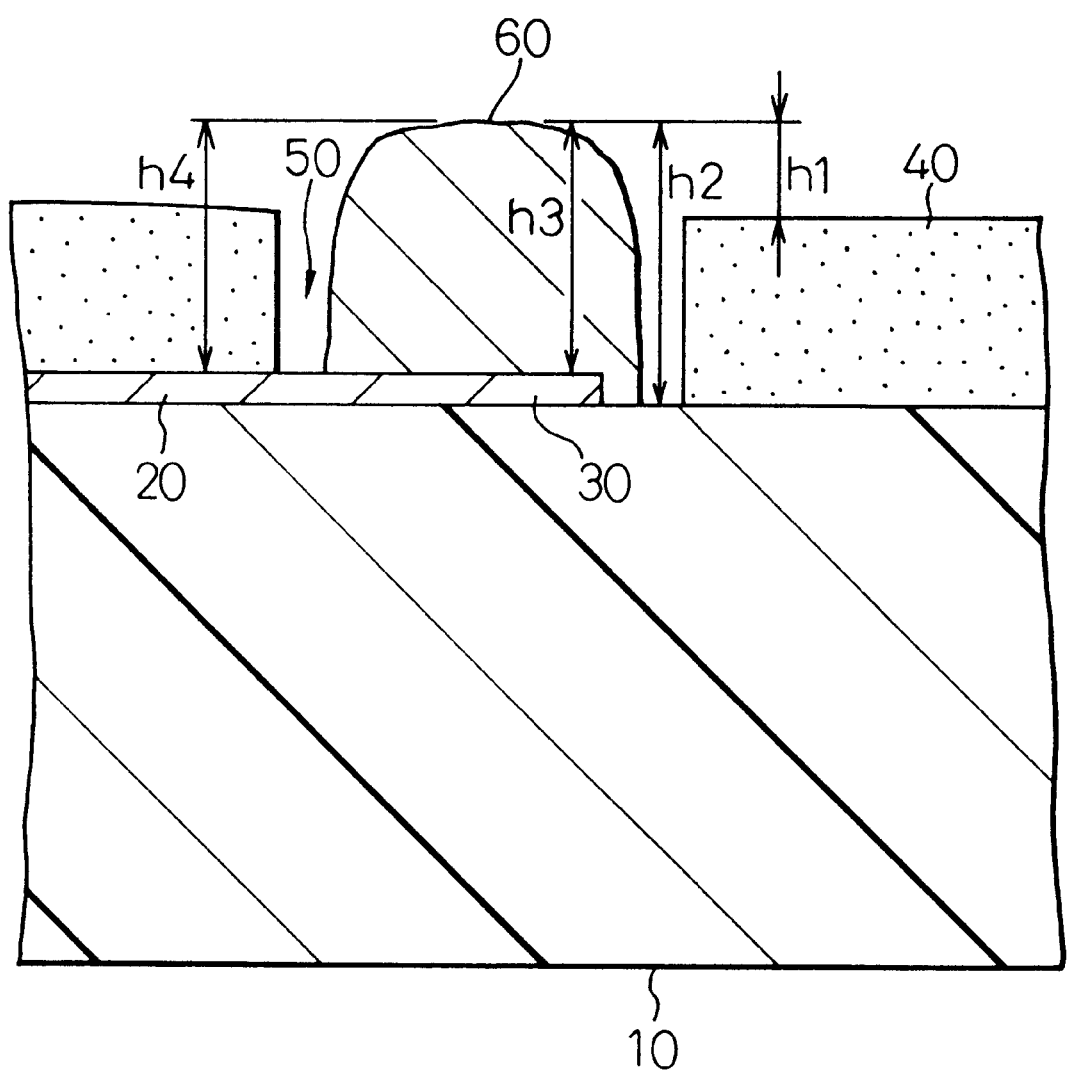
FIG. 16 is an enlarged front sectional view of the first circuit board in the vicinity of a conductor bump.
Figure 17:
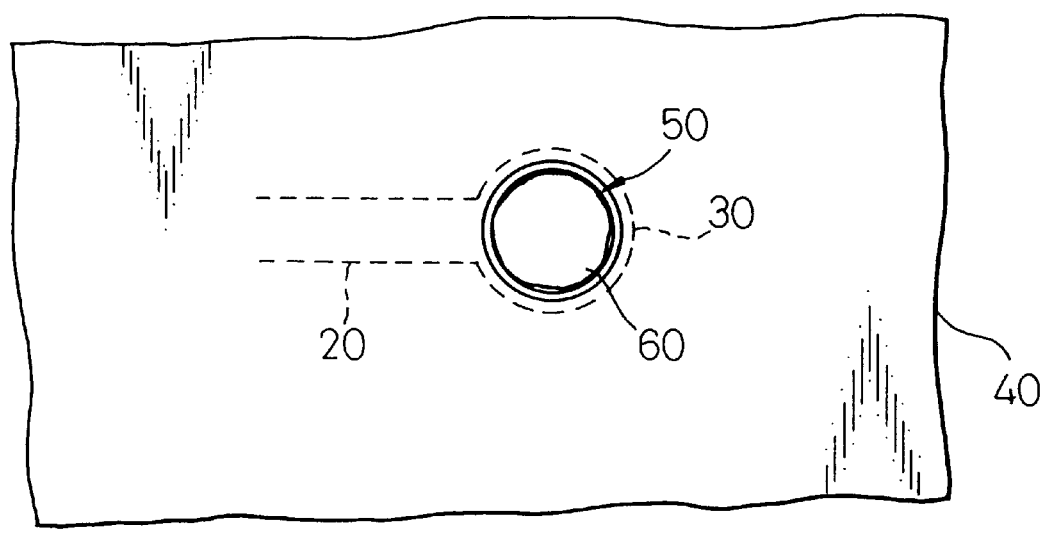
FIGS. 17 and 18 are a partially enlarged plan view and a sectional view of a first circuit board, respectively.
Figure 18:
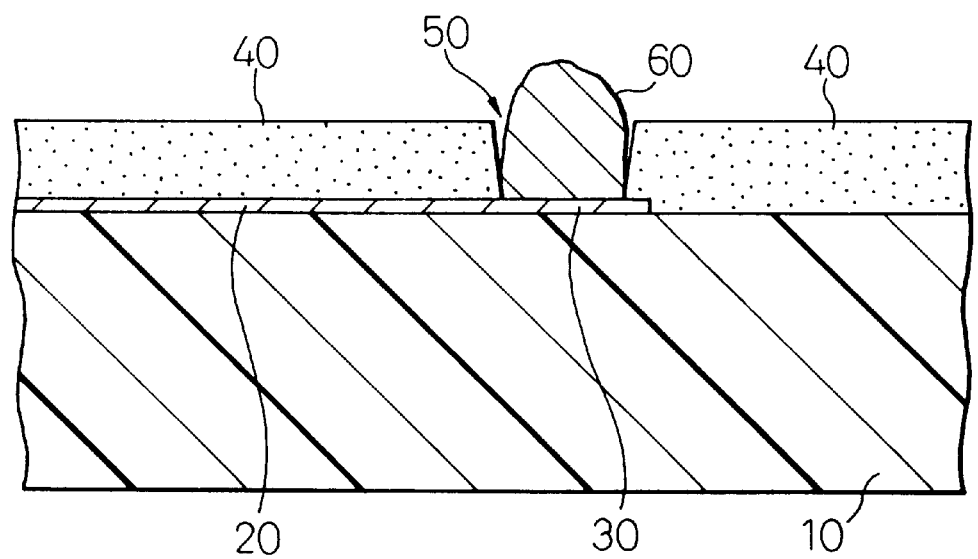
Figure 19:
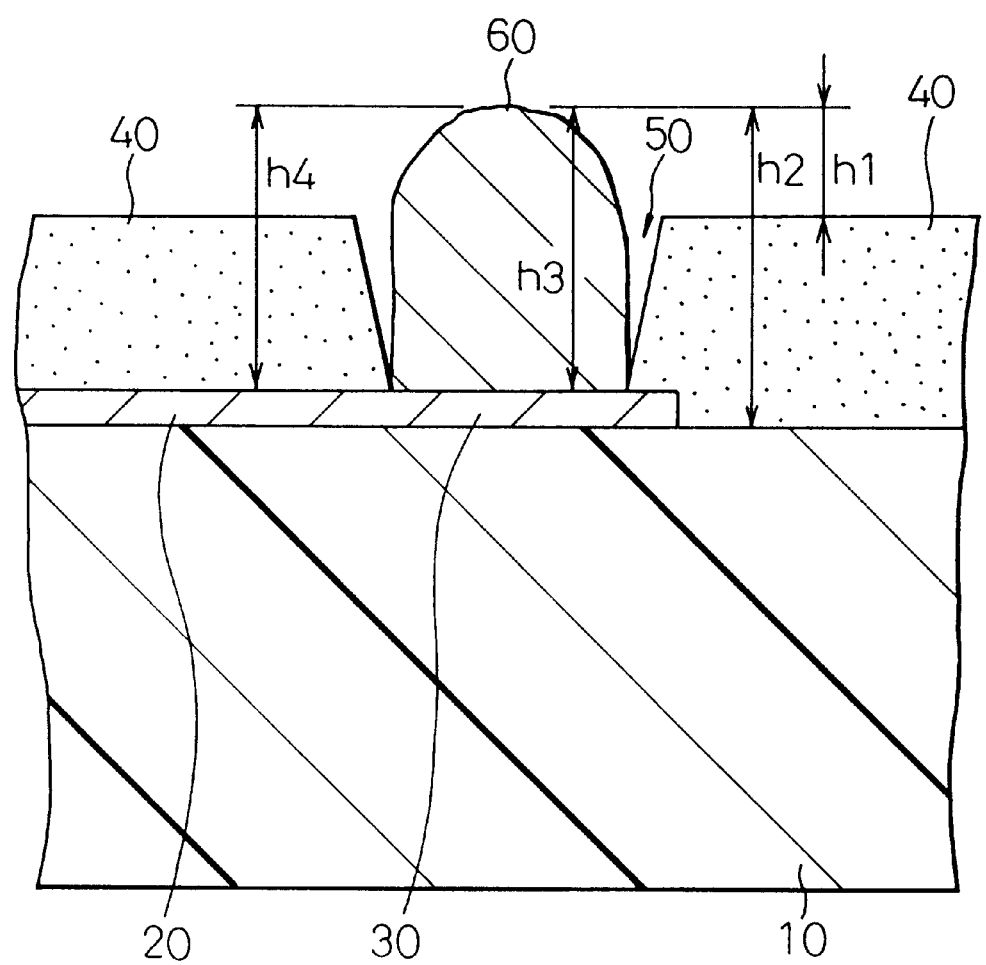
FIG. 19 is an enlarged front sectional view of another first circuit board in the vicinity of a conductor bump.

The remainder of the circuit board other than described above is the same as that described with reference to FIGS. 14 to 16. in this first circuit board, the measurement hole 104 or 106 formed in the resist layer 40 may be provided to be continuous to the opening 50 also formed in the resist layer 40. Thereby, a tool for forming the measurement hole 104 or 106 and the opening 50 can be simplified and the process for forming the measurement hole 104 or 106 and the opening 50 becomes easy. operations other than the above are the same as those of the first circuit board described with reference to FIG. 2.

In the first circuit board shown in FIG. 5 or 6, it is better to avoid the exposure of the surface of the substrate 10, on which the circuit pattern 20 is formed, in the measurement holes 104 or 106.

This is because, in such a case, if the conductor bump 60 is formed on the conductor pad 30 exposed in the opening 50, part of the conductor bump 60 flows to the circuit pattern 20 connected to the conductor pad 30 exposed in the opening 50. Thereby, it is impossible to properly form the conductor bump 60 having a generally semispherical shape on the conductor pad 30 exposed in the opening 50.

Figure 7:
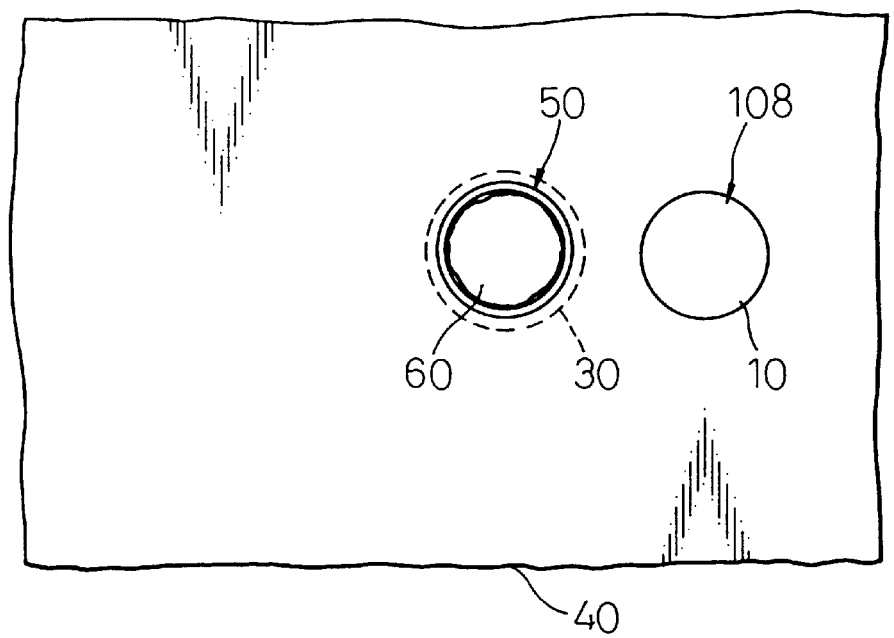
FIGS. 7 to 10 are partially enlarged plan views of various aspects of a second circuit board of the present invenion, respectively.
Figure 8:
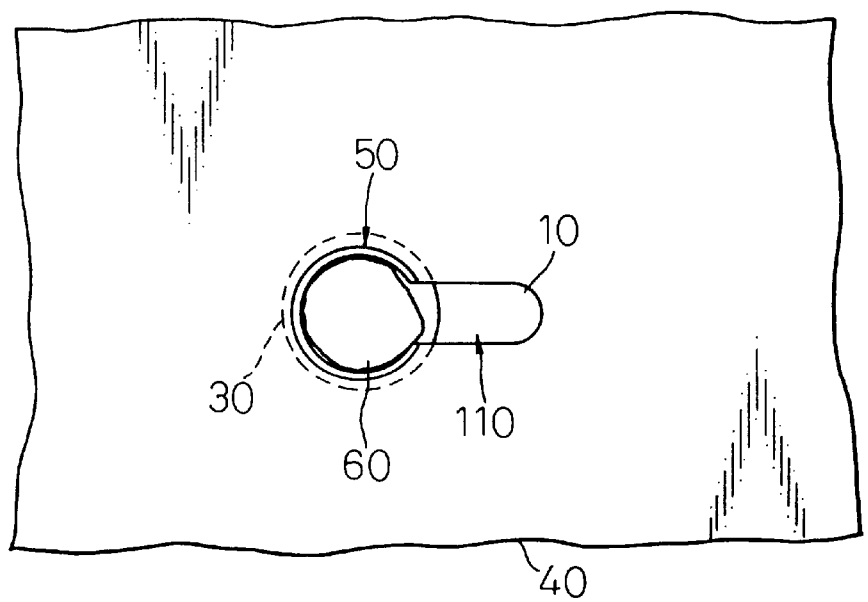
Figure 9:
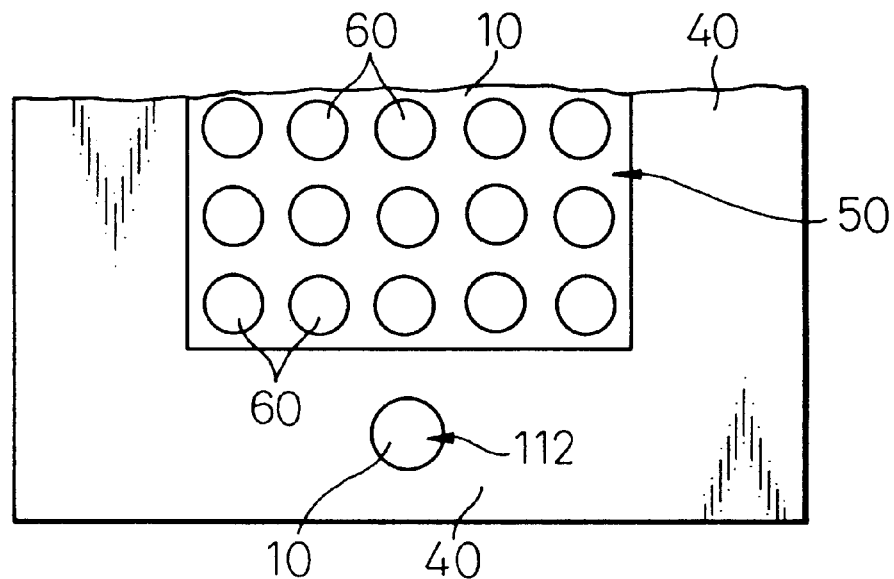
Figure 10:
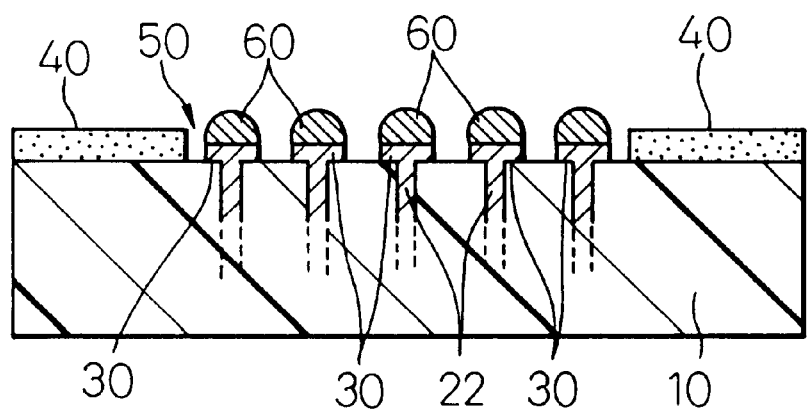
Figure 11:
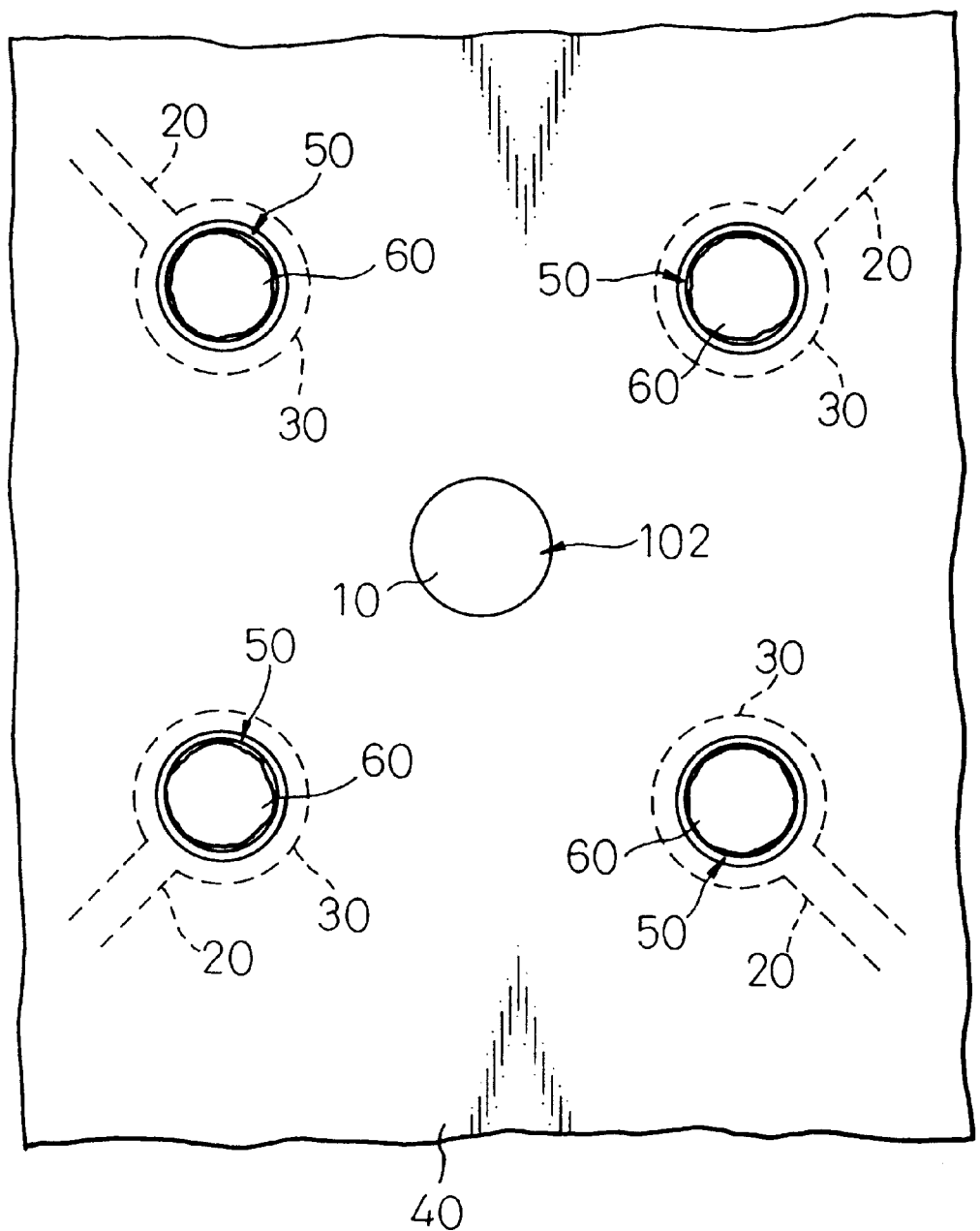
FIGS. 11 and 12 are partially enlarged plan views of a first circuit board of the present invention, respectively.
Figure 12:
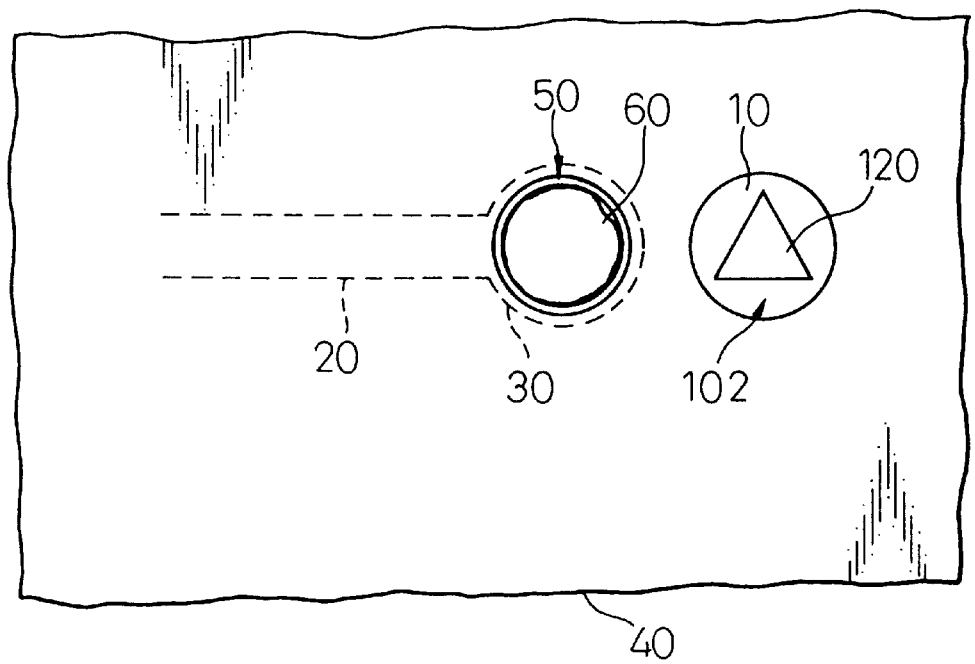
Figure 13:
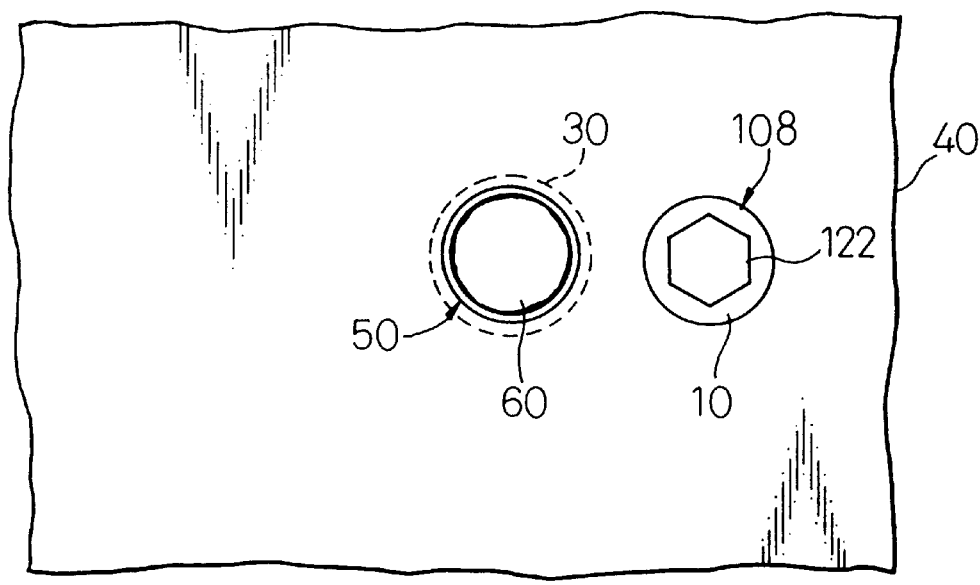
FIG. 13 is a partially enlarged plan view of a second circuit board of the present invention.

FIGS. 7 and 8 are partially enlarged plan views, respectively, of other preferable embodiments of a second circuit board of the present invention.

In the second circuit board shown in FIG. 7, a measurement hole 108 of a circular shape or the like is provided in the resist layer 40 in the vicinity of the opening 50 but separate therefrom. The surface of the substrate 10 defining the reference surface is exposed in the measurement hole 108.

In the second circuit board shown in FIG. 8, an elongate measurement hole 110 is provided in the resist layer 40 in the vicinity of the opening 50, while extending outward therefrom. The surface of the is substrate 10 defining the reference surface is exposed in the measurement hole 110.

Figure 20:
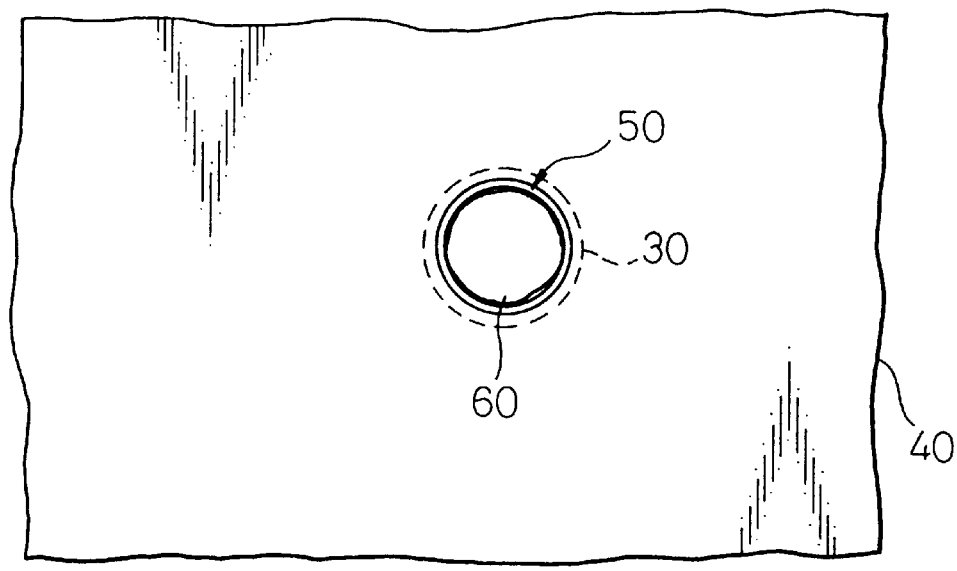
FIGS. 20 and 21 are a partially enlarged plan view and a sectional view of a second circuit board, respectively.
Figure 21:
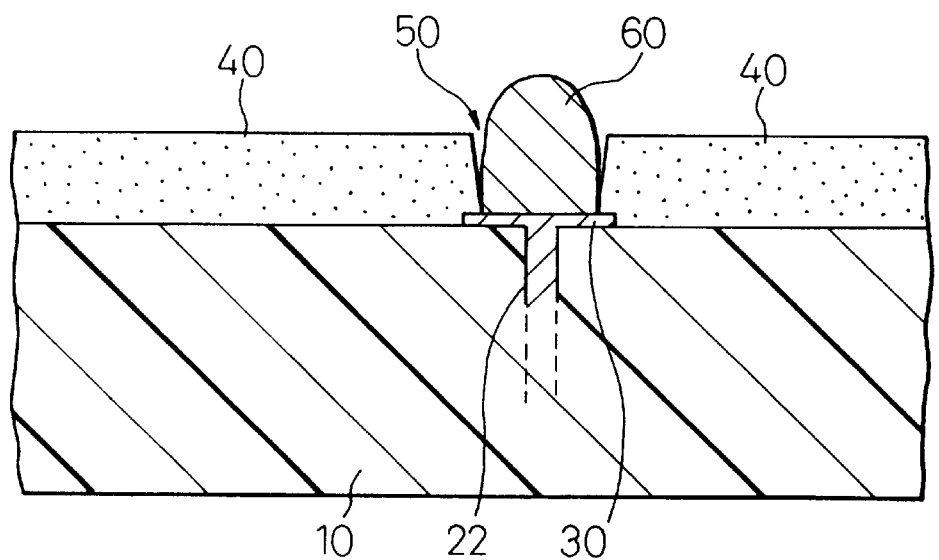
Figure 22:
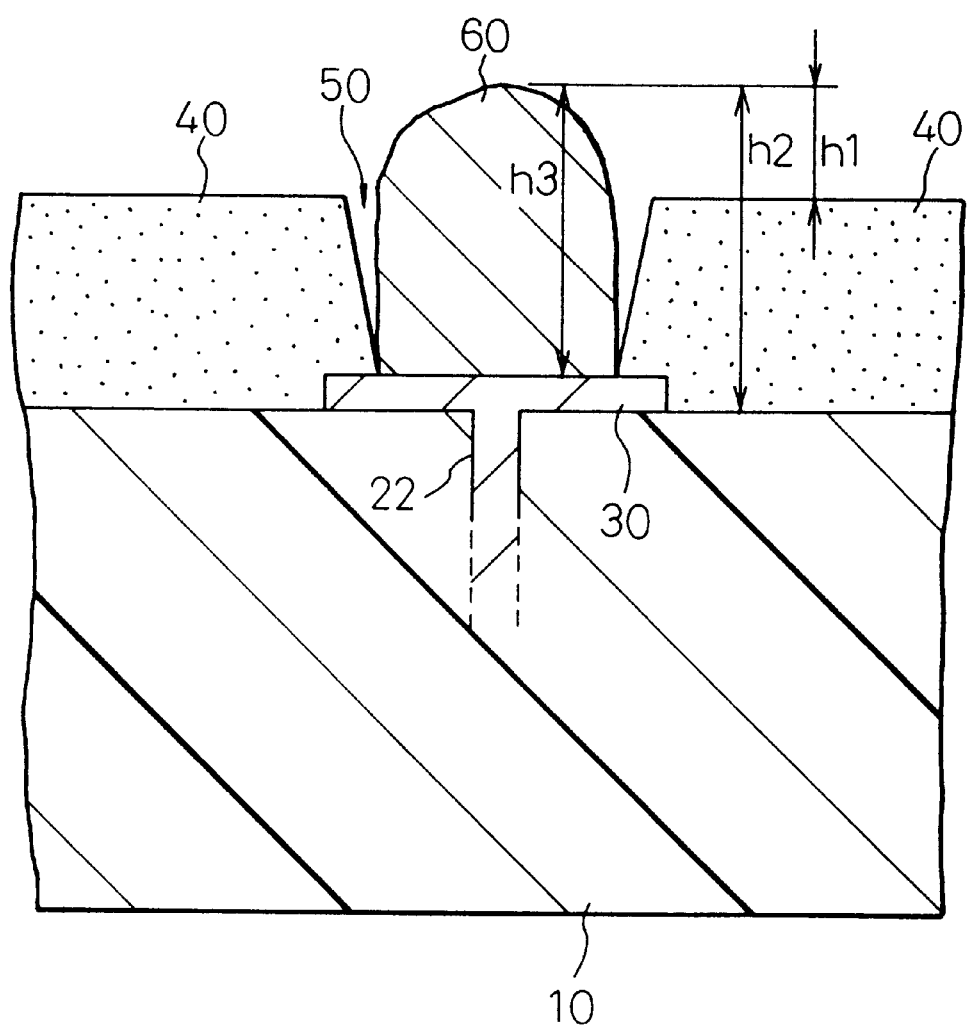
FIG. 22 is an enlarged front sectional view of another second circuit board in the vicinity of a conductor bump.
Figure 23:
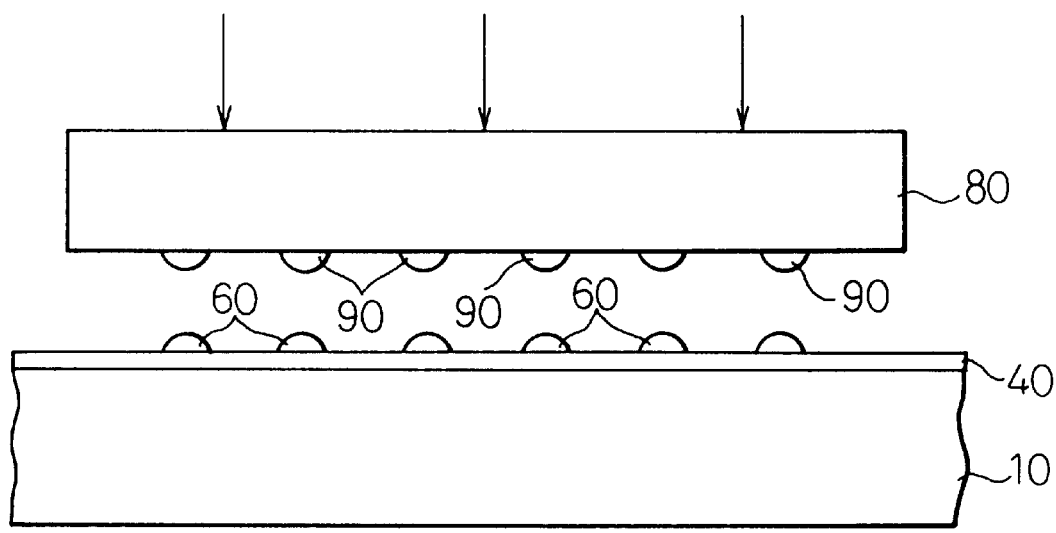
FIGS. 23 and 24 are illustrations for explaining a semiconductor chip on a circuit board.
Figure 24:
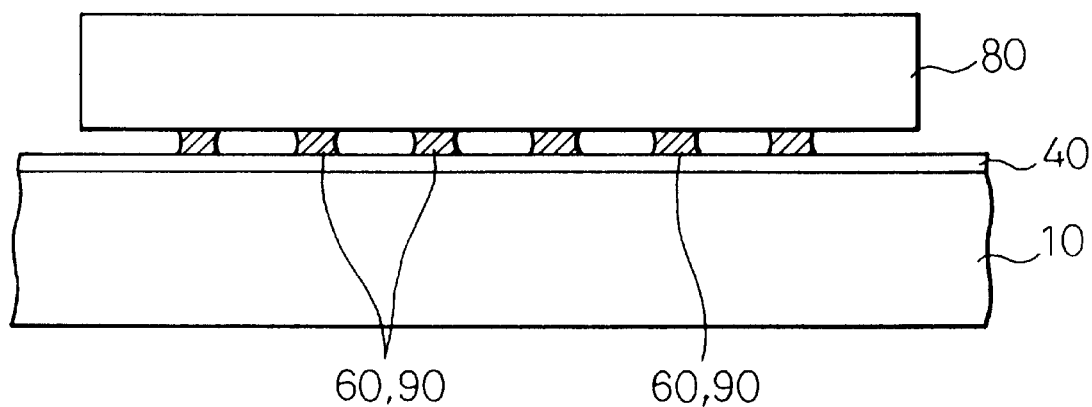

Each of the measurement holes 108 and 110 has a predetermined size or more so that the surface of the substrate 10 defining the reference surface having a predetermined size or more is exposed in the measurement hole 108 or 110. Thus, a laser beam or a visible ray emitted from the optical detector disposed above the resist layer 40 as described before is directed to the substrate 10 through the measurement hole 108 or 110 and reflects or diffuses on the surface of the substrate 10 exposed in the measurement hole 108 or 110. The reflected or diffused ray can be incident upon the optical detector through the measurement hole 108 or 110 without interference from the resist layer 40 around the measurement hole 108 or 110. Alternatively, it is possible to easily and properly focus the CCD camera disposed above the resist layer 40 as described before, on the surface of the substrate 10 exposed in the measurement hole 108 or 110, having the predetermined size or more defining the reference surface without the interference with the resist layer around the measurement hole 108 or 110, The remainder of the circuit board other than described above is the same as that described with reference to FIGS. 20 to 22.

In the second circuit board shown in FIG. 7 or 8, it is possible to direct a laser beam or a visible ray emitted from the optical detector disposed above the resist layer 40 to the substrate 10 through the widely opened measurement hole 108 or 110 without the interference with the resist layer 40 and it is possible to reflect or diffuse the laser beam or the visible ray on the surface of the substrate 10 having the predetermined size exposed in the measurement hole 108 or 110. The reflected or diffused ray is incident upon the optical detector disposed above the resist layer 40 through the widely opened measurement hole 108 or 110 without interference from the resist layer.

Together therewith, it is possible to cause the laser beam or the visible ray emitted from the optical detector disposed above the resist layer 40 to be incident upon the top of the conductor bump 60 in the opening 50 and reflect or diffuse the same on the top of the bump 60. The reflected or diffused ray is incident upon the optical detector disposed above the resist layer 40.

The reflected or diffused ray reflected or diffused on the surface of the substrate 10 and incident upon the optical detector and the reflected or diffused ray reflected or diffused on the top of the conductor bump 60 are used to directly measure the height h2 from the surface of the substrate 10 defining the reference surface to the top of the conductor bump 60. Based on the measured value, it is possible to correctly determine the variation of the height of the conductor bump 60 formed on the substrate 10.

Also, it is possible to easily and properly focus the CCD camera disposed above the resist layer 40 on the surface of the substrate 10 having the predetermined size or more, exposed in the measurement hole 108 or 110, without interference from the resist layer 40. A distance from the CCD camera to the surface of the substrate 10 is measurable by the CCD camera.

Together therewith, a CCD camera disposed above the resist layer 40 can be focussed on the top of the conductor bump 60 exposed in the conductor bump 60, and a distance from the CCD camera to the top of the conductor bump 60 is measurable by the CCD camera.

It should be understood by those skilled in the art that the foregoing description relates to only some preferred embodiments of the disclosed invention, and that various changes and modifications may be made to the invention without departing from the spirit and scope thereof.

What is claimed is:

1. A circuit board for mounting thereon a semiconductor chip, said circuit board comprising:
    a substrate having a surface;
    a wiring circuit formed on said substrate surface;
    a conducting pad to be electrically connected to an electrode of a semiconductor chip which is to be mounted on said substrate;
    an insulating resist layer formed on said substrate surface to cover said wiring circuit, said resist layer having an opening to expose therein said conducting pad;
    a conducting bump formed on said conducting pad which is exposed in said opening; and
    said resist layer having a measuring opening which exposes a reference surface so that a height of said conducting bump can be measured by an optical means using said measuring opening.

2. A circuit board as set forth in claim 1, wherein said reference surface is a part of said substrate surface.

3. A circuit board as set forth in claim 1, wherein said reference surface is an upper surface of said wiring circuit.

4. A circuit board as set forth in claim 1, wherein said reference surface is an upper surface of a reference pattern formed on said substrate surface.

5. A circuit board as set forth in claim 1, wherein said measuring opening is separate from, but in the vicinity of, said opening.

6. A circuit board as set forth in claim 1, wherein said measuring opening is extended from said opening.

7. A circuit board for mounting thereon a semiconductor chip, said circuit board comprising:
    a substrate having first and second surfaces;
    a conducting via provided in a via hole penetrating through said substrate from said first surface to said second surface;
    a conducting pad formed on said first surface of the substrate to be electrically connected to an electrode of a semiconductor chip which is to be mounted on said substrate;
    an insulating resist layer formed on said first surface, said resist layer having an opening to expose therein said conducting pad;
    a conducting bump formed on said conducting pad which is exposed in said opening;
    said resist layer having a measuring opening which exposes a reference surface so that a height of said conducting bump can be measured by an optical means using said measuring opening.

8. A circuit board as set forth in claim 7, wherein said reference surface is a part of said first surface.

9. A circuit board as set forth in claim 7, wherein said reference surface is an upper surface of a reference pattern formed on said first surface.

10. A circuit board as set forth in claim 7, wherein said measuring opening is separate from, but in the vicinity of, said opening.

11. A circuit board as set forth in claim 7, wherein said measuring opening is extended from said opening.

12. In a circuit board for mounting thereon a semiconductor chip, said circuit board comprising: a substrate having a surface; a wiring circuit formed on said substrate surface; a conducting pad to be electrically connected to an electrode of a semiconductor chip which is to be mounted on said substrate; an insulating resist layer formed on said substrate surface to cover said wiring circuit, said resist layer having an opening to expose therein said conducting pad; a conducting bump formed on said conducting pad which is exposed in said opening; and said resist layer having a measuring opening which exposes a reference surface:

a method for measuring a height of said conducting bump comprising:

first step of irradiating a laser or visible beam from a position above said resist layer through said measuring opening toward said reference surface and receiving said laser or visible beam reflected or dispersed at said reference surface through said measuring opening, and also irradiating a laser or visible beam from said position above said resist layer through said opening toward a top of said conducting bump and receiving said laser or visible beam reflected or dispersed at said conducting bump through said opening; and second step of comparing these reflected or dispersed beams to determine the height of said conducting bump.

13. A method as set forth in claim 12, wherein said reference surface is a part of said substrate surface.

14. A method as set forth in claim 12, wherein said reference surface is an upper surface of said wiring circuit.

15. A method as set forth in claim 12, wherein said reference surface is an upper surface of a reference pattern formed on said substrate surface.

16. A method as set forth in claim 12, wherein said measuring opening is separate from, but in the vicinity of, said opening.

17. A method as set forth in claim 12, wherein said measuring opening is extended from said opening.

18. In a circuit board for mounting thereon a semiconductor chip, said circuit board comprising: a substrate having first and second surfaces; a conducting via provided in a via hole penetrating through said substrate from said first surface to said second surface; a conducting pad formed on said first surface of the substrate to be electrically connected to an electrode of a semiconductor chip which is to be mounted on said substrate; an insulating resist layer formed on said first surface, said resist layer having an opening to expose therein said conducting pad; a conducting bump formed on said conducting pad which is exposed in said opening; and said resist layer having a measuring opening which expose a reference surface so that a height of said conducting bump can be measured by an optical means using said measuring opening;

a method for measuring a height of said conducting bump comprising:

first step of irradiating a laser or visible beam from a position above said resist layer through said measuring opening toward said reference surface and receiving said laser or visible beam reflected or dispersed at said reference surface through said measuring opening, and also irradiating a laser or visible beam from said position above said resist layer through said opening toward a top of said conducting bump and receiving said laser or visible beam reflected or dispersed at said conducting bump through said opening; and second step of comparing these reflected or dispersed beams to determine the height of said conducting bump.

19. A method as set forth in claim 18, wherein said reference surface is a part of said first surface.

20. A method as set forth in claim 18, wherein said reference surface is an upper surface of a reference pattern formed on said first surface.

21. A method as set forth in claim 18, wherein said measuring opening is separate from, but in the vicinity of said opening.

22. A method as set forth in claim 18, wherein said measuring opening is extended from said opening.

* * * * *